(12) United States Patent
Liu

(10) Patent No.: US 10,420,228 B1
(45) Date of Patent: Sep. 17, 2019

(54) INTEGRATING APPARATUS FOR ELECTRONIC DEVICES

(71) Applicant: I SHOU UNIVERSITY, Kaohsiung (TW)

(72) Inventor: Shyh-Chang Liu, Kaohsiung (TW)

(73) Assignee: I Shou University, Kaohsiung (TW)

( * ) Notice: Subject to any disclaimer, the term of this patent is extended or adjusted under 35 U.S.C. 154(b) by 0 days.

(21) Appl. No.: 16/048,468

(22) Filed: Jul. 30, 2018

(30) Foreign Application Priority Data

Apr. 13, 2018 (TW) .............................. 107112654 A

(51) Int. Cl.
*H05K 5/00* (2006.01)
*H05K 5/02* (2006.01)

(52) U.S. Cl.
CPC ......... *H05K 5/0021* (2013.01); *H05K 5/0017* (2013.01); *H05K 5/0221* (2013.01); *H05K 5/0247* (2013.01)

(58) Field of Classification Search
CPC .. H05K 5/0021; H05K 5/0017; H05K 5/0221; H05K 5/0247
See application file for complete search history.

(56) References Cited

U.S. PATENT DOCUMENTS

| | | | | |
|---|---|---|---|---|
| 9,545,140 B1* | 1/2017 | Johnson | ................. | A45C 11/00 |
| 10,314,185 B2* | 6/2019 | Cavenagh | ............ | H05K 5/0226 |
| 2007/0017685 A1* | 1/2007 | Moore | ................. | G11B 33/142 |
| | | | | 174/17 VA |
| 2009/0050365 A1* | 2/2009 | Moore | ................. | G11B 33/142 |
| | | | | 174/547 |
| 2011/0188179 A1* | 8/2011 | Myers | .................... | G06F 1/1626 |
| | | | | 361/679.01 |
| 2012/0118773 A1* | 5/2012 | Rayner | ................. | G06F 1/1626 |
| | | | | 206/320 |
| 2012/0314354 A1* | 12/2012 | Rayner | .................. | H01H 13/06 |
| | | | | 361/679.01 |
| 2013/0223836 A1* | 8/2013 | Gibbs | ...................... | H01Q 9/42 |
| | | | | 396/535 |
| 2014/0168866 A1* | 6/2014 | Armstrong | ........... | H05K 5/0021 |
| | | | | 361/679.01 |
| 2014/0177140 A1* | 6/2014 | Wang | ..................... | H02G 11/00 |
| | | | | 361/679.01 |
| 2014/0262848 A1* | 9/2014 | Fathollahi | .............. | A45C 11/00 |
| | | | | 206/37 |
| 2014/0334084 A1* | 11/2014 | Fricker | .................... | H05K 1/14 |
| | | | | 361/679.4 |
| 2015/0146401 A1* | 5/2015 | Su | ........................ | H05K 5/0247 |
| | | | | 361/807 |

(Continued)

*Primary Examiner* — Binh B Tran
*Assistant Examiner* — Douglas R Burtner
(74) *Attorney, Agent, or Firm* — Fox Rothschild LLP; Robert J. Sacco; Carol E. Thorstad-Forsyth

(57) ABSTRACT

An integrating apparatus for integrating a plurality of electronic devices includes an elongated frame member and a plurality of spaced-apart connecting plugs. Each of the electronic devices includes a main body that is formed with a receptacle and a display that is mounted in the main body. The frame member is flexible, has opposite end portions separably coupled to each other, and is adapted for encircling and positioning the main bodies of the electronic devices. The connecting plugs protrude from the frame member, are electrically connected to each other, and are adapted for electric connection with the receptacles of the main bodies of the electronic devices.

13 Claims, 11 Drawing Sheets

(56) References Cited

U.S. PATENT DOCUMENTS

| | | | |
|---|---|---|---|
| 2015/0189780 A1* | 7/2015 | Su | H05K 5/0247 361/807 |
| 2015/0257286 A1* | 9/2015 | Sichmann | H01R 4/4809 361/732 |
| 2015/0289388 A1* | 10/2015 | Conway | H05K 5/0021 312/236 |
| 2015/0289389 A1* | 10/2015 | Conway | B65D 21/0209 220/4.02 |
| 2016/0192509 A1* | 6/2016 | Hacking | H05K 5/0004 312/263 |
| 2016/0381819 A1* | 12/2016 | Glaser | G06F 1/1656 361/679.01 |
| 2017/0020013 A1* | 1/2017 | Chuang | H05K 5/0021 |
| 2017/0086551 A1* | 3/2017 | Rayner | A45C 13/008 |
| 2018/0062327 A1* | 3/2018 | Gotz | H01R 9/2408 |
| 2018/0139857 A1* | 5/2018 | Cavenagh | A45C 11/00 |
| 2018/0342858 A1* | 11/2018 | Meyer | H02G 3/04 |

* cited by examiner

INTEGRATING APPARATUS FOR ELECTRONIC DEVICES

CROSS-REFERENCE TO RELATED APPLICATION

This application claims priority of Taiwanese Patent Application No. 107112654, filed on Apr. 13, 2018.

FIELD

The disclosure relates to an integrating apparatus, and more particularly to an integrating apparatus for integrating a plurality of electronic devices.

BACKGROUND

Electronic devices such as smartphones, notebooks, tablet computers, etc. are widely used due to their availability and portability, and are gradually becoming indispensible tools in modern society. Since the electronic devices are designed to be highly portable, family members or friends would often want to watch a movie or taking photographs during gathering sessions using their personal electronic device. Due to the limited screen size of the electronic devices, not only better video effects cannot be obtained, and in order for the users to view a particular screen at the same time, the users need to huddle together in a small space, or the particular electronic device need to be rotated among the users. Although application software are now available to allow multiple electronic devices to form a large screen in parallel, these application software do not hold the electronic devices together. For viewing purpose, the electronic devices need to be placed on the same plane, which is easy for misalignment to occur through accidental touching or sliding the screens of the electronic devices, causing much inconvenience. In addition, since battery power capacity of each of the electronic devices is different, therefore, it often happens that the electronic devices suddenly run out of battery power during usage, or the application software cannot be utilized due to insufficient battery power of the electronic devices.

SUMMARY

Therefore, an object of the disclosure is to provide an integrating apparatus that can alleviate at least one of the drawbacks of the prior art.

According to the disclosure, an integrating apparatus is adapted for integrating a plurality of electronic devices. Each of the electronic devices includes a main body that is formed with a receptacle and a display that is mounted in the main body. The integrating electronic device includes an elongated frame member and a plurality of spaced-apart connecting plugs. The frame member is flexible, has opposite end portions separably coupled to each other, and is adapted for encircling and positioning the main bodies of the electronic devices. The connecting plugs protrude from the frame member, are electrically connected to each other, and are adapted for electric connection with the receptacles of the main bodies of the electronic devices.

BRIEF DESCRIPTION OF THE DRAWINGS

Other features and advantages of the present disclosure will become apparent in the following detailed description of the embodiment with reference to the accompanying drawings, of which.

DETAILED DESCRIPTION

Figure 1:
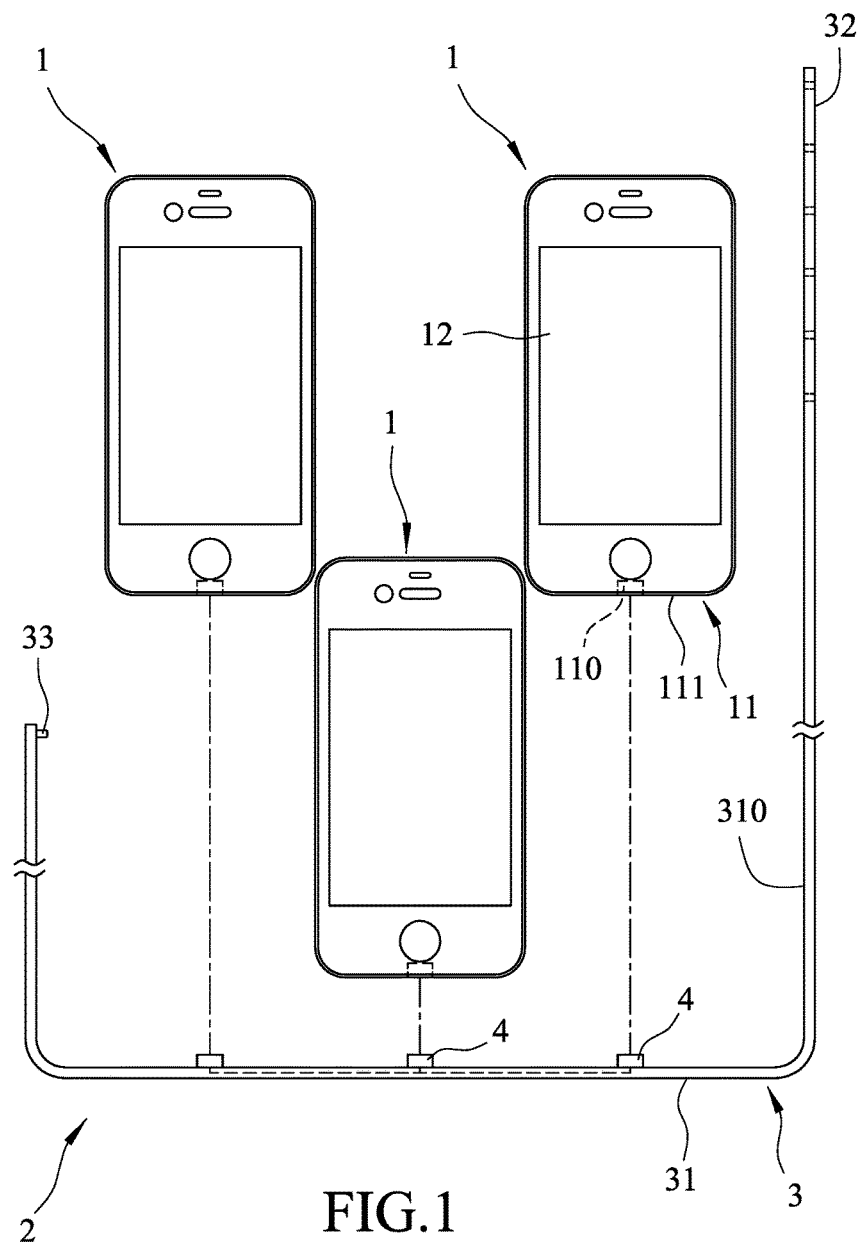
FIG. 1 is a schematic view showing an embodiment of an integrating apparatus according to the present disclosure.
Figure 2:
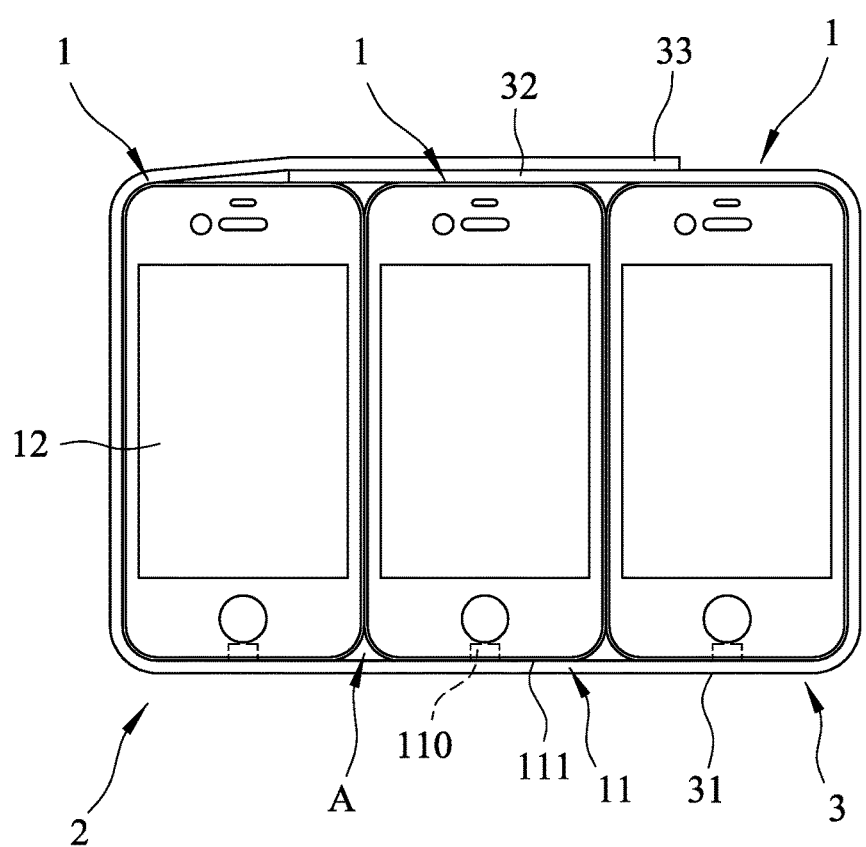
FIG. 2 is a schematic view showing a general form of using the integrating apparatus of the embodiment.

Referring to FIGS. 1 and 2, an embodiment of the integrating apparatus 2 is adapted for integrating a plurality of electronic devices 1. Each of the electronic devices 1 includes a main body 11 and a display 12 that is mounted in the main body 11. The main body 11 has a side surface 111 surrounding the display 12 and is formed with a receptacle 110.

The integrating apparatus 2 includes a flexible, elongated frame member 3 having opposite first and second end portions 32, 33 that are separably coupled to each other, and a plurality of spaced-apart connecting plugs 4 that protrude from the frame member 3 and that are electrically connected to each other. Each of the connecting plugs 4 is adapted for electric connection with the receptacle 110 of a corresponding one of the electronic devices 1. The frame member 3 includes a frame body portion 31, a first connecting end portion 32 that is connected to an end of the frame body portion 31, and a second connecting end portion 33 that is connected to an opposite end of the frame body portion 31. The frame body portion 31 is adapted for encircling and contacting the side surfaces 111 of the main bodies 11 of the electronic devices 1. The first connecting end portion 32 has a plurality of blind holes formed in the frame body portion 31, and the number, location and spacing of the blind holes may vary according to actual needs. The second connecting end portion 33 is a protrusion that is inserted removably into one of the blind holes. The first and second connecting end portions 32,33 may be configured as structures that can be detached from each other, but are not limited thereto, as one of magnets, a latch mechanism, a snap fastener mechanism, a hook-and-loop mechanism, a snap-fit mechanism, and a shackle mechanism. The frame body portion 31 of the frame member 3 has an anti-slip surface 310 that is adapted for contacting the main bodies 11 of the electronic devices 1, and the connecting plugs 4 protrude from the anti-slip surface 310. Material used to make the frame member 3 may be silicon rubber, polyurethane or polycarbonate.

Referring to FIG. 2, in actual use, the frame member 3 encircles the main bodies 11 of the electronic devices 1 with the first connecting end portion 32 being connected to the second connecting end portion 33, so as to define an integrated region (A). The main bodies 11 of the electronic devices 1 are positioned by the frame body portion 31 to fix the displays 12 in parallel positions in the integrated region (A). The anti-slip surface 310 is attached to the side surfaces 111 of the electronic devices 1 to prevent the main bodies 11 from slipping out or coming off during usage. After multiple displays 12 are fixed in position, image sharing or synchronization through application software installed in the electronic devices 1 can be carried out by combining the multiple displays 12 into a large screen. Since the electronic devices 1 are connected to each other through the connecting plugs 4, battery power and built-in application software can be shared among each other, thereby enabling data sharing and avoiding inconsistent usage time due to difference in battery power. Since related data sharing technologies are known to those skilled in the art, further details thereof are not provided herein for the sake of brevity. In addition, when the user is in need of assistance during distress, the multiple displays 12 of the electronic devices 1 of this embodiment can be constructed into a large screen to show large-sized SOS fonts to draw attention of emergency and rescue personnel or vehicles passing by. Similarly, the integrated large screen of the electronic devices 1 can be used as a large-scale billboard for displaying names of participants or slogans during games or performances.

Figure 3:
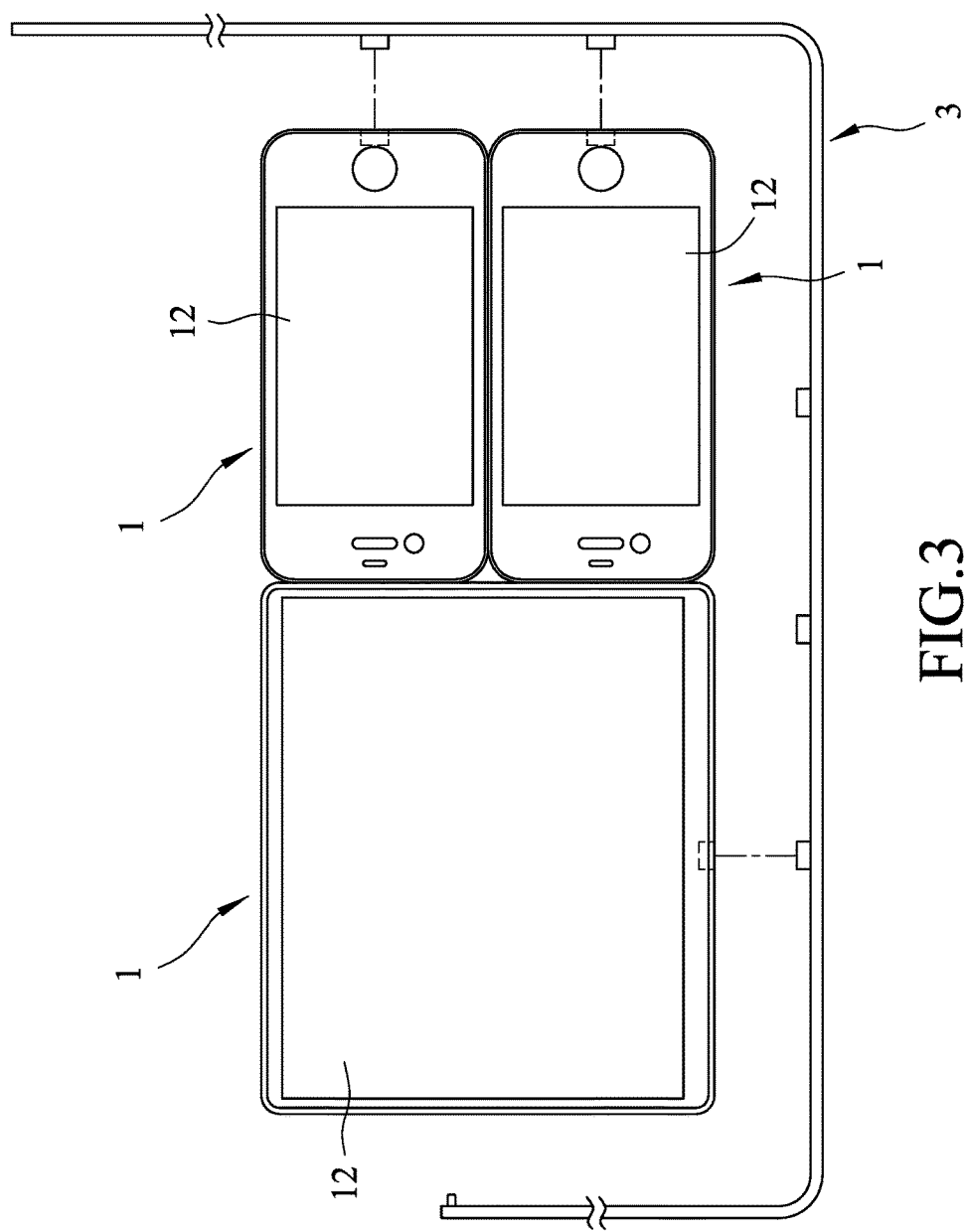
FIGS. 3 to 8 are schematic views showing other forms of using the integrating apparatus of the embodiment.
Figure 4:
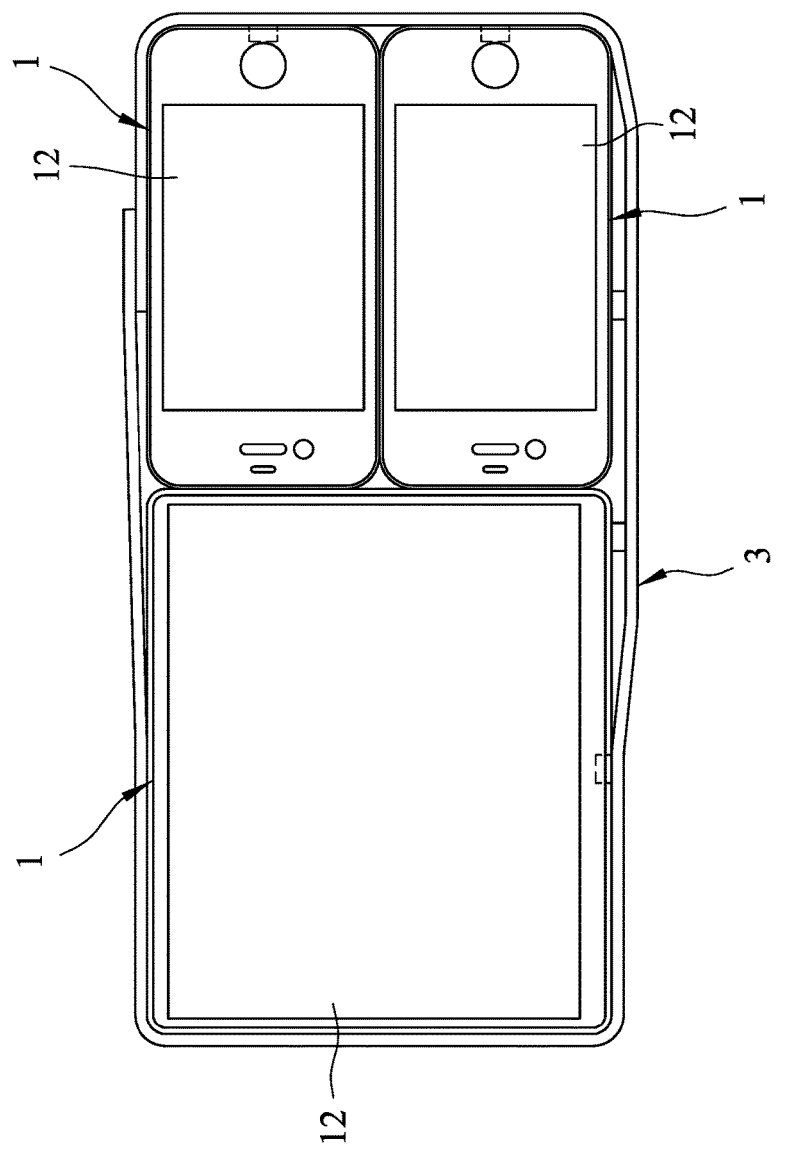
Figure 5:
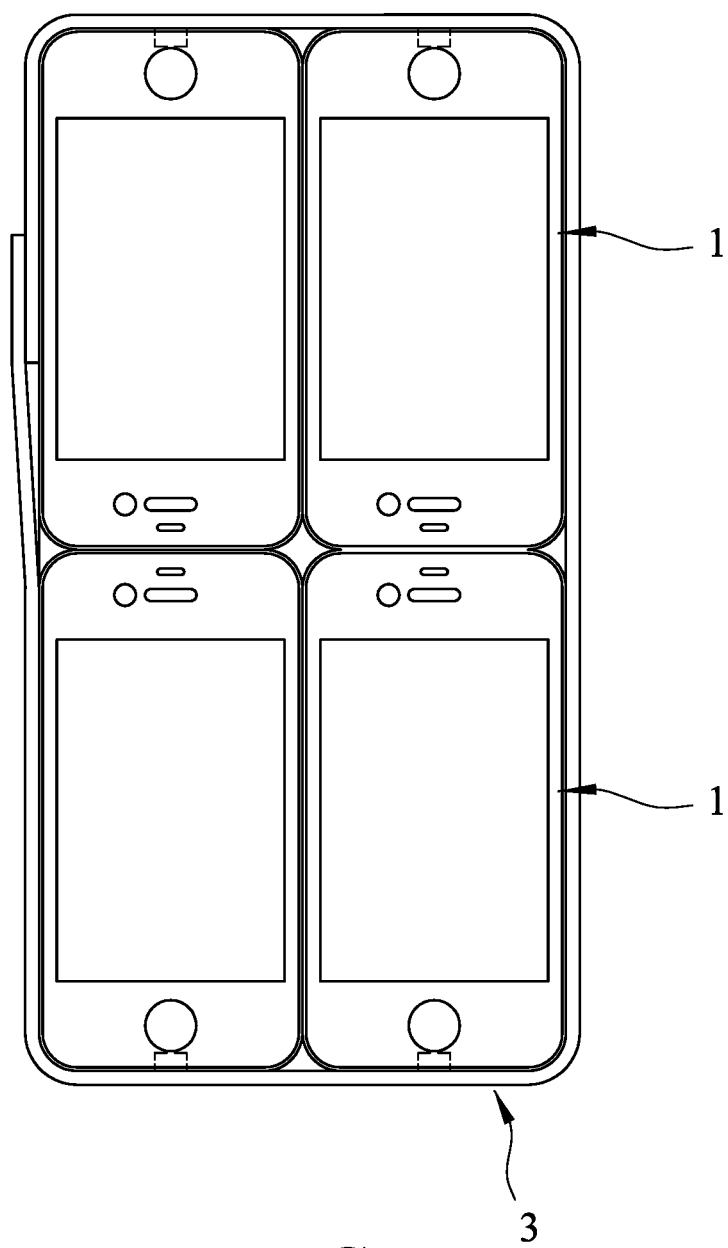
Figure 6:
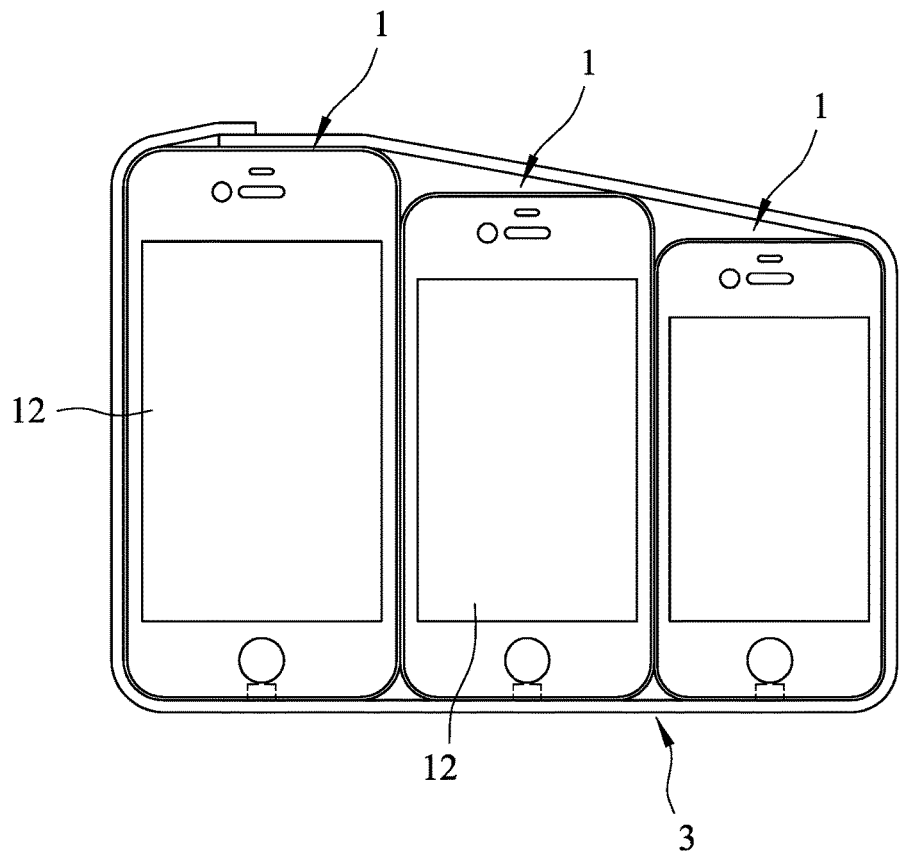

Referring to FIGS. 3 to 6, since the frame member 3 of this embodiment limits the position of the electronic devices 1 by encircling manner, the electronic devices 1 can be arranged in different directions or multiple columns in addition to the single row arrangement in the same direction, and the types and sizes of the display 12 of the electronic devices 1 do not necessarily have to be similar. As shown in FIGS. 3 and 4, the integrated large screen is composed of one electronic device 1 having a large-sized display 12 and two electronic devices 1 each having a small-sized display 12. FIG. 5 shows an arrangement of a plurality of electronic devices 1 having the same size, while FIG. 6 shows an arrangement of three electronic devices 1 having different sizes, therefore, this embodiment have a high degree of versatility.

Figure 7:
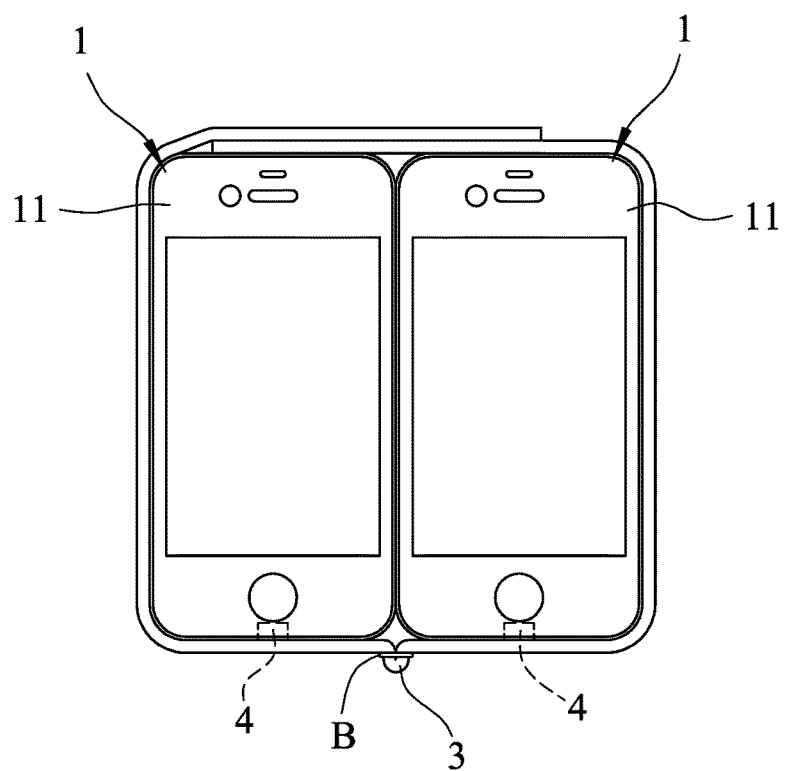
Figure 8:
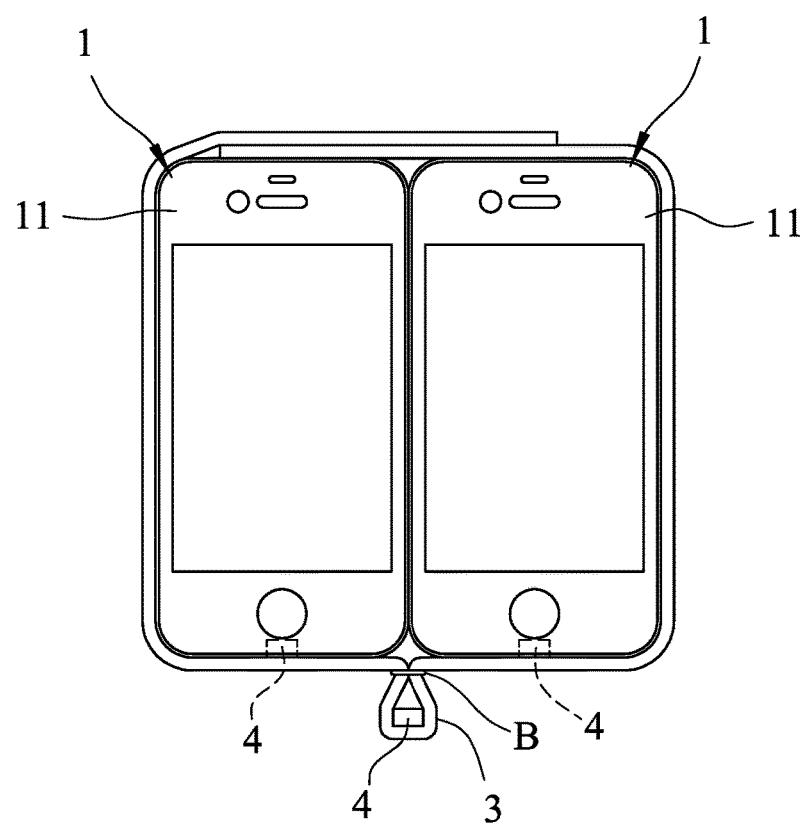

When two electronic devices 1 are respectively and electrically connected to two adjacent connecting plugs 4, but the widths of the main bodies 11 of the electronic devices 1 are not enough to be abutted against each other, a redundant portion of the frame member 3 between the two connecting plugs 4 can be folded and pulled outwards and then fix with a clamp (B) or other methods as shown in FIG. 7. Even when there are other connecting plugs 4 present between the two connecting plugs 4 in cases where the main bodies 11 of the two adjacent electronic devices 1 are too wide to be coupled to two adjacent connecting plugs 4, a redundant portion of the frame member 3 can be folded along with the other connecting plugs 4 and then pulled outwards as shown in FIG. 8. Therefore, in this embodiment, slight adjustment of the integrating apparatus 2 can be done according to the different sizes of the displays 12.

Figure 9:
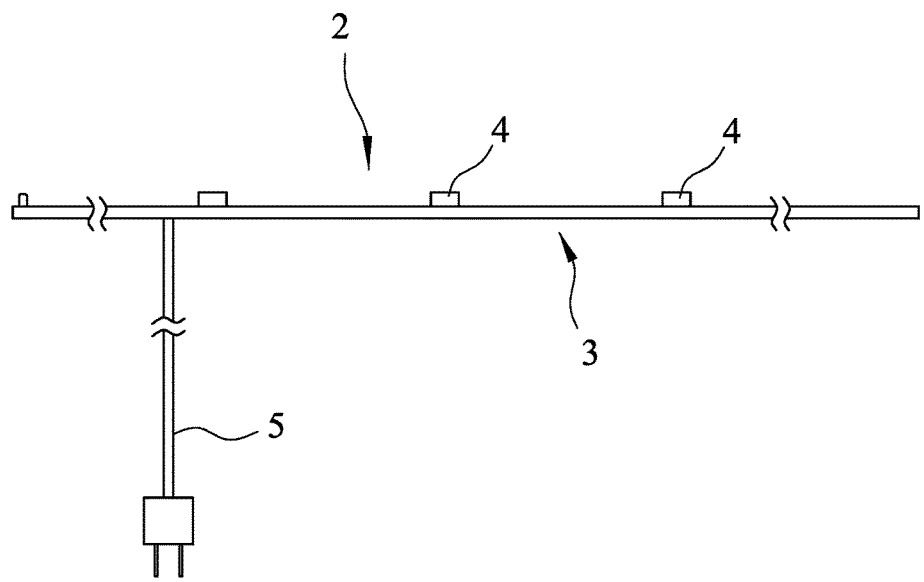
FIG. 9 is a schematic view showing the embodiment of the integrating apparatus may further include a connecting cable.
Figure 10:
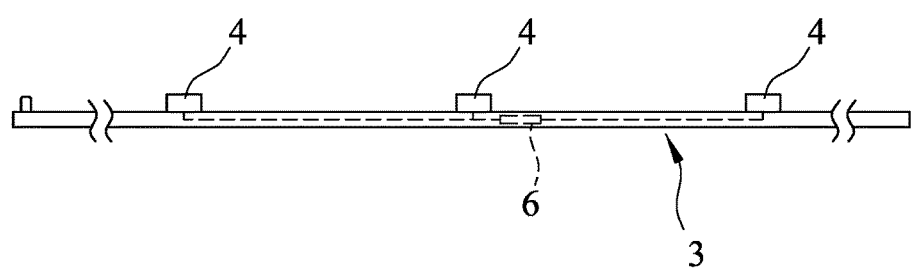
FIG. 10 is a schematic view showing the embodiment of the integrating apparatus may further include a communication module.

Referring to FIG. 9, in this embodiment, the integrating apparatus 2 may further include a connecting cable 5 connected electrically to the connecting plugs 4. When the electronic devices 1 are connected electrically on the connecting plugs 4, charging of battery power and data transfer can be carried out simultaneously, enabling significant increase in the usage time of the electronic devices 1, thereby achieving the effect of exchanging and sharing data. The connecting cable 5 may be configured as a charging cable capable of transmitting data in the form of digital signals. In addition to exchanging and sharing data, extranet route connection can be established, enabling the electronic devices 1 to have wired Internet access. Furthermore, as shown in FIG. 10, in this embodiment, a built-in communication module 6 can be embedded in the frame member 3 to be electrically connected to the connecting plugs 4. The communication module 6 may be configured as one of a wireless network (WiFi) module, a near-field communication (NFC) module, and a Bluetooth module, and can be used for close distance data transmission, thereby increasing transmission mode of this embodiment. When the electronic devices 1 are inoperable due to absence of signal from the connecting plugs 4, data transmission by WiFi can be employed, thus solving non-integration issues.

Figure 11:
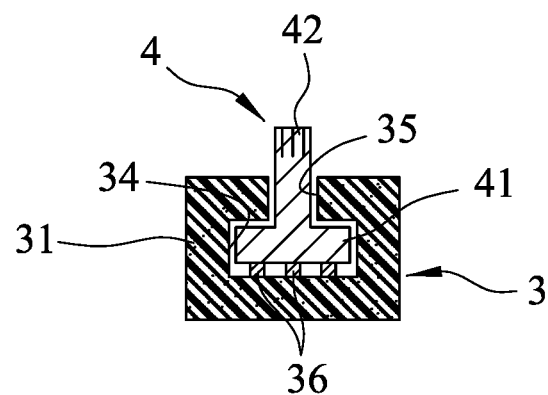
FIG. 11 is a sectional view showing an arrangement of a connecting plug of the embodiment.

Referring to FIG. 11 in combination with FIG. 1, in a modification of the embodiment of the integrating apparatus 2, the frame body portion 31 of the frame member 3 has a C-shaped cross-section and defines a slide groove 34. The slide groove 34 has an opening 35 that extends in a longitudinal direction of the frame body portion 31. The opening 35 is in spatial communication with an external environment. The frame member 3 further has an electrode unit having a plurality of electrodes 36 that are disposed in the slide groove 34. Each of the connecting plugs 4 includes a slide segment 41 that is disposed slidably in the slide groove 34, and a contact segment 42 that extends from the slide segment 41 to the external environment through the opening 35. The slide segment 41 is connected electrically and slidably to the electrodes 36 of the electrode unit, allowing the connecting plugs 4 to slide freely along the frame member 3. Therefore, positions of the connecting plugs 4 on the frame member 3 can be adjusted according to the sizes and receptacle positions of the electronic devices 1 by changing spacing between the adjacent connecting plugs 4, thereby improving general usage and ease of adjusting the integrated apparatus 2.

Figure 12:
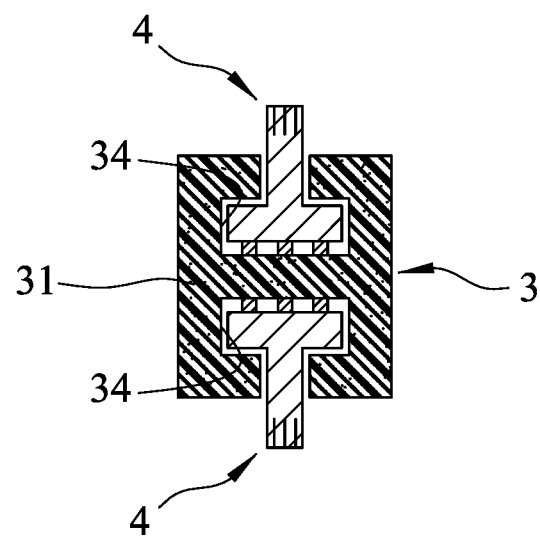
FIG. 12 is a sectional view showing another arrangement of two connecting plugs of the embodiment.
Figure 13:
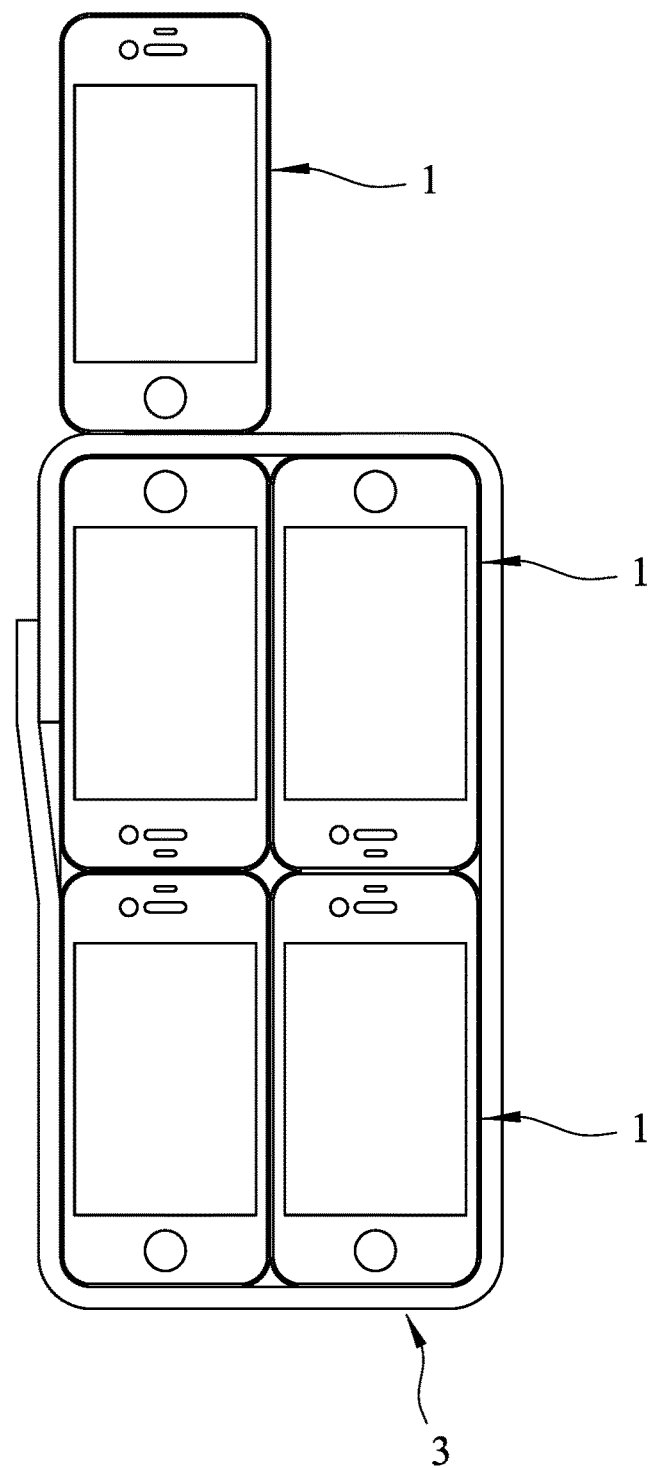
FIG. 13 is a schematic view showing a form of using the embodiment that has the connecting plugs arranged based on FIG. 12.

Referring to FIG. 12 and in combination with FIG. 1, another modification of the embodiment is illustrated in which the frame body portion 31 of the frame member 3 has a substantially H-shaped cross-section and defines two slide grooves 34. As shown in FIG. 13, the connecting plugs 4 thus disposed in the slide grooves 34 can be projected in two different directions so that both sides of the frame member 3 can be connected to the electronic devices 1, thereby improving functionality and flexibility of configuration of the integrating apparatus 2.

In summary, since the frame member 3 is flexible and can encircle and position different sizes of the electronic devices 1, it is therefore easy for the users to hold or move the electronic devices 1, and also provides the users with better viewing experience by combining the multiple displays 12 of the electronic devices 1 into a large screen. In addition, since the electronic devices 1 can be connected to each other through the connecting plugs 4, sharing of battery power and application software can be carried out based on their average endurance, thus avoiding inconsistent time usage of each of the electronic devices 1 due to different capacity of the battery power. The integrating apparatus 2 of this disclosure therefore achieves its function of integrating and sharing data online.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An integrating apparatus adapted for integrating a plurality of electronic devices, each of the electronic devices including a main body that is formed with a receptacle and a display that is mounted in the main body, said integrated apparatus comprising:
    an elongated frame member that is flexible, that has opposite end portions separably coupled to each other, and that is adapted for encircling and positioning the main bodies of the electronic devices; and
    a plurality of spaced-apart connecting plugs that protrude from said frame member, that are electrically connected to each other, and that are adapted for electric connection with the receptacles of the main bodies of the electronic devices.

2. The integrating apparatus as claimed in claim 1, wherein said frame member has:
    a frame body portion that is adapted for encircling and contacting side surfaces of main bodies of the electronic devices which are respectively formed with the receptacles of the main bodies of the electronic devices;
    a first connecting end portion that is connected to an end of said frame body portion; and
    a second connecting end portion that is connected to an opposite end of said frame body portion and that is coupled separably to said first connecting end portion.

3. The integrating apparatus as claimed in claim 2, further comprising a connecting cable connected electrically to said connecting plugs.

4. The integrating apparatus as claimed in claim 3, further comprising a communication module that is configured as one of a Wi-Fi module, a near-field communication module, and a Bluetooth module.

5. The integrating apparatus as claimed in claim 4, wherein said first and second connecting end portions are configured as one of magnets, a latch mechanism, a snap fastener mechanism, a hook-and-loop mechanism, a snap-fit mechanism, and a shackle mechanism.

6. The integrating apparatus as claimed in claim 3, wherein said first and second connecting end portions are configured as one of magnets, a latch mechanism, a snap fastener mechanism, a hook-and-loop mechanism, a snap-fit mechanism, and a shackle mechanism.

7. The integrating apparatus as claimed in claim 2, wherein said first and second connecting end portions are configured as one of magnets, a latch mechanism, a snap fastener mechanism, a hook-and-loop mechanism, a snap-fit mechanism, and a shackle mechanism.

8. The integrating apparatus as claimed in claim 1, wherein said first and second connecting end portions are configured as one of magnets, a latch mechanism, a snap fastener mechanism, a hook-and-loop mechanism, a snap-fit mechanism, and a shackle mechanism.

9. The integrating apparatus as claimed in claim 1, wherein said frame member has an anti-slip surface that is adapted for contacting the main bodies of the electronic devices, said connecting plugs protruding from said anti-slip surface.

10. The integrating apparatus as claimed in claim 1, wherein the said frame member is made of a material that is selected from a group consisting of silicone rubber, polyurethane, and polycarbonate.

11. The integrating apparatus as claimed in claim 2, wherein:
    said frame body portion of said frame member has a slide groove that has an opening; and
    each of said connecting plugs has a slide segment that is disposed slidably in said slide groove, and a contact segment that extends from said slide segment through said opening.

12. The integrating apparatus as claimed in claim 11, wherein said frame member further has an electrode unit having a plurality of electrodes that are disposed in said slide groove, said slide segment of each of said connecting plugs being connected electrically and slidably to said electrode unit.

13. The integrating apparatus as claimed in claim 3, wherein said connecting cable is configured as a charging cable capable of data transfer in the form of digital signals.

* * * * *